(12) United States Patent
Sadra et al.

(10) Patent No.: US 7,327,591 B2
(45) Date of Patent: Feb. 5, 2008

(54) STAGGERED MEMORY CELL ARRAY

(75) Inventors: Kayvan Sadra, Addison, TX (US);
Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/870,355

(22) Filed: Jun. 17, 2004

(65) Prior Publication Data
US 2005/0281098 A1    Dec. 22, 2005

(51) Int. Cl.
*G11C 5/06* (2006.01)

(52) U.S. Cl. .......................................... 365/63; 365/51

(58) Field of Classification Search ............. 365/63, 365/51, 56, 60, 69, 72
See application file for complete search history.

(56) References Cited

U.S. PATENT DOCUMENTS

| | | | | |
|---|---|---|---|---|
| 5,691,933 A | * | 11/1997 | Takenaka | 365/63 |
| 6,157,214 A | * | 12/2000 | Marshall | 326/41 |
| 6,385,083 B1 | * | 5/2002 | Sharma et al. | 365/171 |

OTHER PUBLICATIONS

Fukaura et al., "A Highly Manufacturable High Density embedded SRAM Technology for 90nm CMOS," IEDM 2002.

* cited by examiner

*Primary Examiner*—Tuan T. Nguyen
*Assistant Examiner*—Hien Nguyen
(74) *Attorney, Agent, or Firm*—Jacqueline J. Garner; W. James Brady, III; Frederick J. Telecky, Jr.

(57) ABSTRACT

A method of placing a cell in an array is disclosed. The method includes placing the cell a plurality of times (600, 602, 604) in a first array. The cell is also placed a plurality of times (606, 608, 610) in a second array. The second array is placed adjacent and offset from the first array by an offset distance ($O_2$).

27 Claims, 14 Drawing Sheets

STAGGERED MEMORY CELL ARRAY

FIELD OF THE INVENTION

This invention generally relates to electronic circuits, and more specifically to geometric layout efficiency of semiconductor integrated circuits.

BACKGROUND OF THE INVENTION

The continuing popularity of portable electronic devices presents manufacturers with significant challenges. Increasing capability of electronic devices is moderated by considerations of cost, size, weight, and battery life. These considerations have increasingly resulted in higher levels of semiconductor integration. Thus, portable electronic devices frequently embed memory, control, signal processors, and other circuit functions on a single integrated circuit. Further optimization of these portable electronic devices dictates even greater reduction in geometric feature sizes and spaces between these geometric features. Geometric feature size and space reduction of semiconductor integrated circuits, however, is limited by state-of-the-art fabrication equipment. Reduction of geometric feature sizes and spaces beyond manufacturing equipment capability inevitably results in short or open circuit conditions of the multi-layer geometric features. These short or open circuit conditions often render the semiconductor integrated circuit inoperable, thereby degrading yield, the functional fraction of total semiconductor integrated circuit product. The degraded yield, therefore, must be balanced against feature size and space reduction in an effort to minimize size and cost of the semiconductor integrated circuit.

Semiconductor integrated circuit manufacturers constantly strive to optimize layout of geometric features of semiconductor integrated circuits to reduce overall size without degrading yield. For example, Fukaura et al., *A Highly Manufacturable High Density Embedded SRAM Technology for 90 nm CMOS*, IEDM Technical Digest, 2002, disclose two types of memory cell layouts to achieve a target memory cell size. The Type A cell of Fukaura et al. is reproduced as cell 300 of FIG. 3 together with five other cells. The memory cells are placed in various views to form an array of memory cells. These memory cells are aligned vertically and horizontally with adjacent cells in the array. This alignment facilitates straight interconnections such as bitlines, wordlines, and power lines between cells. These straight interconnections are generally shorter and may have less parasitic capacitance and resistance than alternative designs with multiple bends and corners. There are generally eight views as shown at FIG. 1. Each view is illustrated as an upper case "F". View V1 of FIG. 1 is rotated 90 degrees counter clockwise to form view V2. Views V3 and V4 are each rotated another 90 and 180 degrees counter clockwise, respectively. View V5 is a mirror image about a vertical axis of view V4. Views V6, V7, and V8 are formed by rotating 90, 180, and 270 degrees counter clockwise from view V5.

Referring now to FIG. 4, the views of the memory array of FIG. 3 will be explained in detail. Memory cell 300 in the upper left corner of the memory array is placed in view V1. Due to the layout of memory cell 300, view V1 is identical to view V3 as indicated by FIG. 4. Cell 302 is placed below cell 300 in view V6, which is identical to view V8. View V6 is formed by rotating view V1 180 degrees counter clockwise and placing a mirror image about a vertical axis. Cell 304 is placed below cell 302 in view V1. Memory cells 300, 302, and 304, therefore, form a first array of memory cells. Cells 306, 308, and 310 form a second array of memory cells that is adjacent and aligned with the first array of memory cells. Cells 306, 308, and 310 are placed to the right of cells 300, 302, and 304 in views V6, V1, and V6, respectively. Thus, the same placement views are used in both the first and second arrays of memory cells. Views V6, V1, and V6 of cells 306, 308, and 310 are formed as a mirror image about a vertical axis of cells 300, 302, and 304, respectively. These views permit each cell to share other geometries with adjacent cells, thereby conserving layout area as will be explained in detail. Furthermore, these conventional memory cells of the prior art are placed in an array in rows and columns so that they are aligned with each other in the horizontal and vertical directions.

Turning now to FIG. 2, the electrical circuit corresponding to exemplary memory cell 302 of the prior art will be explained in detail. Each memory cell of FIG. 3 is electrically identical to the schematic diagram of FIG. 2. Moreover, the geometric layout of each memory cell of FIG. 3 is substantially identical except that they may be placed in different views as previously explained. Memory cell 302 is bounded above and below by memory cells 300 and 304 as indicated by the solid line cell boundaries. Memory cell 302 includes a latch formed by P-channel load transistors 201 and 202 formed in N-well region 222 and N-channel drive transistors 203 and 204 formed over P-substrate regions outside N-well region 222. These transistors are indicated by polycrystalline silicon gate regions crossing an active region. Here, an active region is formed between isolation regions and may be P+, N+, or a lightly doped channel region under a polycrystalline silicon gate region. Source terminals of P-channel load transistors 201 and 202 are connected to positive Vdd supply voltage in metal (not shown) at metal-to-P+ contact areas 212. Likewise, source terminals of N-channel drive transistors 203 and 204 are connected to ground or Vss supply voltage in metal (not shown) at metal-to-N+ contact areas 214. Each of the metal-to-silicon contact areas 212 and 214 is formed by a half contact in each of two adjacent cells. Output terminals 216 and 218 of the latch are indicated at FIG. 3 as metal-to-N+ contact areas. These output terminals 216 and 218 are connected to access N-channel pass transistors 205 and 206, respectively. Gates of the N-channel pass transistors 205 and 206 are connected to word line 220 indicated by a dashed line. The other terminals of N-channel pass transistors 205 and 206 are connected to bit line $BL_A$ 208 and complementary bit line $/BL_A$ 210 indicated by dotted lines, respectively.

Referring to FIG. 3, there is a layout diagram of the prior art corresponding to the schematic diagram of FIG. 2. Fukaura et al. disclose the minimum size of this cell is determined by the design rules listed at Table 1. In general, any of these design rules may limit the horizontal or vertical dimensions of the memory cell. As such, these limiting design rules are critical dimensions and may not be further reduced without increasing the probability of shorting. Two critical dimensions are indicated at FIG. 3 between cells 300 and 306 which limit the size of individual memory cells. A first critical dimension is distance $P_1$ between adjacent polycrystalline silicon geometries 250 and 252. These geometries are collinear. Because they are aligned end-to-end they cannot be moved closer together without increased shorting of the polycrystalline silicon geometries and decreased yield. A second critical dimension is the distance $C_1$ between metal-to-silicon contact 254 and metal-to-polycrystalline silicon contact 256. A reduction in this distance $C_1$ may result in a metal-to-metal short even if it is possible to reduce distance $P_1$. Thus, the individual memory cell size and corresponding array size are limited by these critical dimensions.

FIGS. 5A and 5B illustrate the symmetry of conventional memory cells of the prior art. The memory cells are placed in view V1. A vertical line Y—Y separates the left and right halves of the memory cell of FIG. 5A. If the right half is rotated 180 degrees and placed on top of the left half, all geometrical layers are aligned. The half contact 502, for example, is aligned with the half contact 500. The top and bottom halves of the cell of FIG. 5B are separated by horizontal line X—X. If the bottom half is rotated 180 degrees and placed on top of the top half, all geometrical layers such as half contacts 506 and 504 are again aligned. Each half of the conventional memory cell of the prior art, therefore, is symmetrical with the other half of the memory cell.

SUMMARY OF THE INVENTION

In accordance with a preferred embodiment of the invention, there is disclosed a method of placing a cell in an array. The cell is placed a plurality of times in a first array in alternating views. The cell is also placed a plurality of times in a second array in alternating views. The second array is placed adjacent and offset from the first array by an offset distance. The offset increases critical distances between adjacent cells and permits a corresponding reduction of cell size. Array size is reduced without degrading yield.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Figure 17:
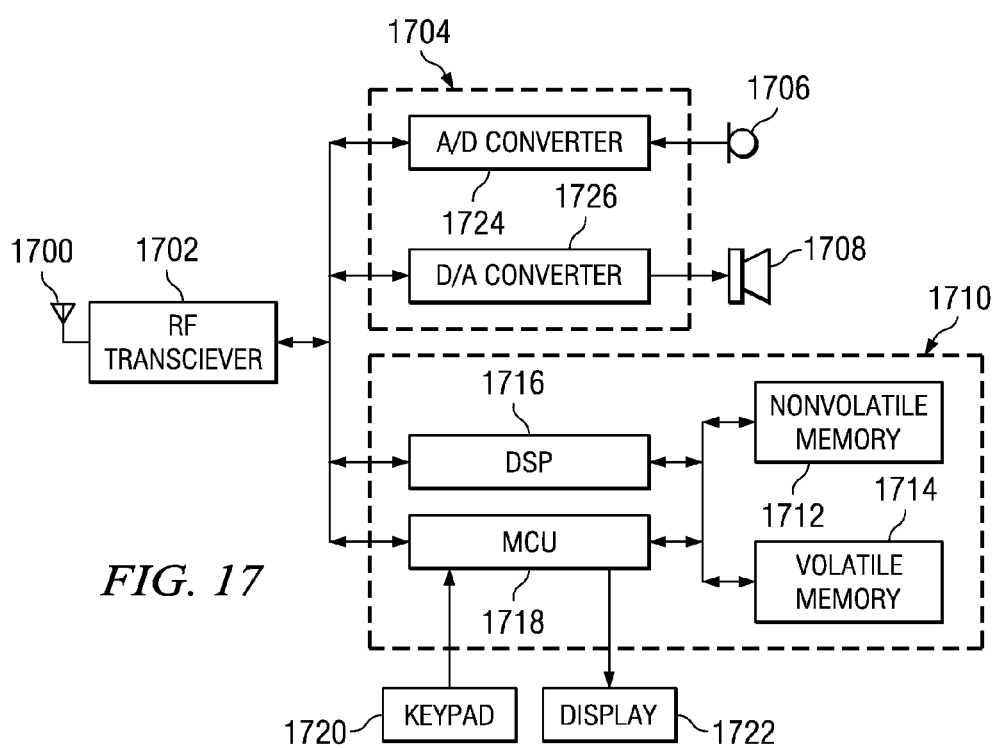
FIG. 17 is a block diagram of a wireless telephone as an example of a portable electronic device which could advantageously employ the present invention.

Referring to FIG. 17, there is a block diagram of a wireless telephone as an example of a portable electronic device which could advantageously employ this invention in memory arrays, decode circuits, interconnect cells, or any other geometrical array as is known in the art. The wireless telephone includes antenna 1700, radio frequency transceiver 1702, baseband circuits 1710, microphone 1706, speaker 1708, keypad 1720, and display 1722. The wireless telephone is preferably powered by a rechargeable battery (not shown) as is well known in the art. Antenna 1700 permits the wireless telephone to interact with the radio frequency environment for wireless telephony in a manner known in the art. Radio frequency transceiver 1702 both transmits and receives radio frequency signals via antenna 1702. The transmitted signals are modulated by the voice/data output signals received from baseband circuits 1710. The received signals are demodulated and supplied to baseband circuits 1710 as voice/data input signals. An analog section 1704 includes an analog to digital converter 1724 connected to microphone 1706 to receive analog voice signals. The analog to digital converter 1724 converts these analog voice signals to digital data and applies them to digital signal processor 1716. Analog section 1704 also includes a digital to analog converter 1726 connected to speaker 1708. Speaker 1708 provides the voice output to the user. Digital section 1710 is embodied in one or more integrated circuits and includes a microcontroller unit 1718, a digital signal processor 1716, nonvolatile memory circuit 1712, and volatile memory circuit 1714. Nonvolatile memory circuit 1712 may include read only memory (ROM), ferroelectric memory (FeRAM), FLASH memory, or other nonvolatile memory as known in the art. Volatile memory circuit 1714 may include dynamic random access memory (DRAM), static random access memory (SRAM), or other volatile memory circuits as known in the art. Microcontroller unit 1718 interacts with keypad 1720 to receive telephone number inputs and control inputs from the user. Microcontroller unit 1718 supplies the drive function to display 1722 to display numbers dialed, the current state of the telephone such as battery life remaining, and received alphanumeric messages. Digital signal processor 1716 provides real time signal processing for transmit encoding, receive decoding, error detection and correction, echo cancellation, voice band filtering, etc. Both microcontroller unit 1718 and digital signal processor 1716 interface with non-volatile memory circuit 1712 for program instructions and user profile data. Microcontroller unit 1718 and digital signal processor 1716 also interface with volatile memory circuit 1714 for signal processing, voice recognition processing, and other applications.

In the layout of an integrated circuit, it is common to group geometries into cells and then place the cells into the layout. The grouping of these geometrical cells and the establishment of cell boundaries is somewhat arbitrary. For clarity, we will define a memory cell as a contiguous group of geometries forming the transistors for a single memory unit wherein the boundaries of the cell go through the mid-point of contacts that are shared between adjacent cells.

Figure 1:
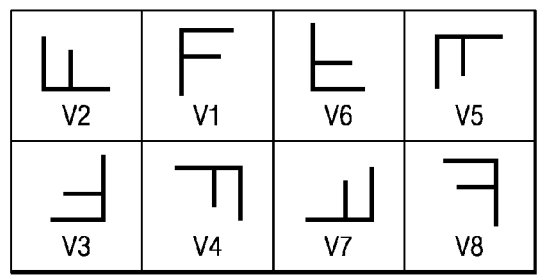
FIG. 1 is a diagram showing eight views in which a cell may be placed.
Figure 2:
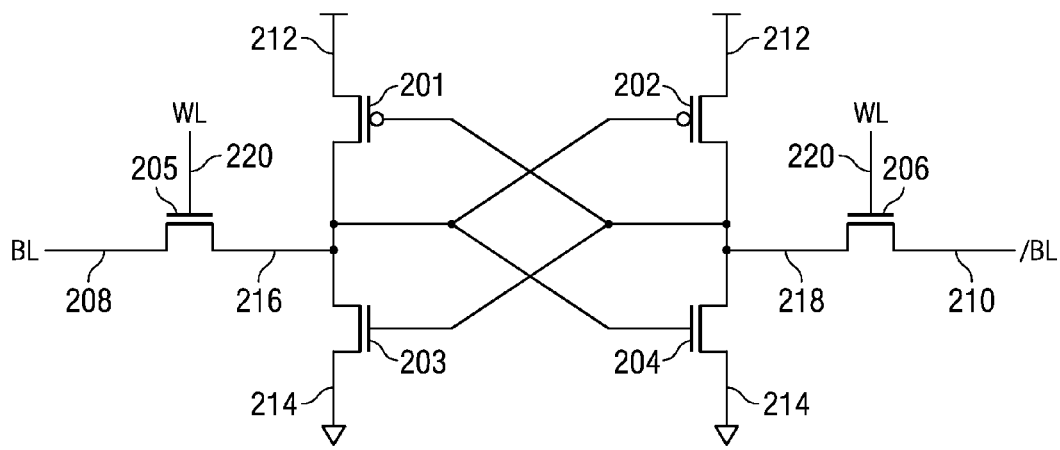
FIG. 2 is a schematic diagram of a six transistor static random access memory cell of the prior art.
Figure 4:
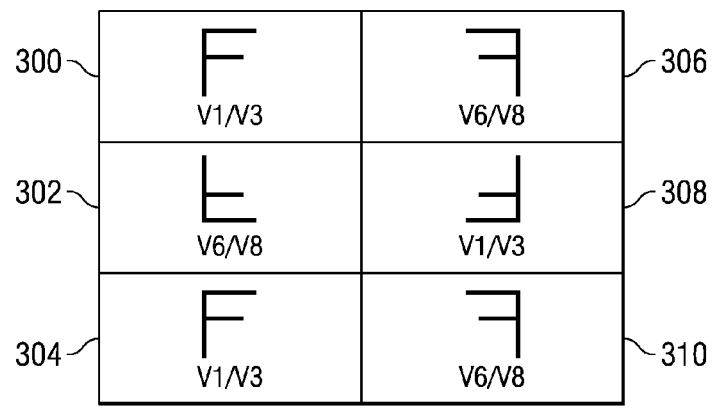
FIG. 4 is a diagram showing the views of the array of six memory cells of FIG. 3.
Figure 7:
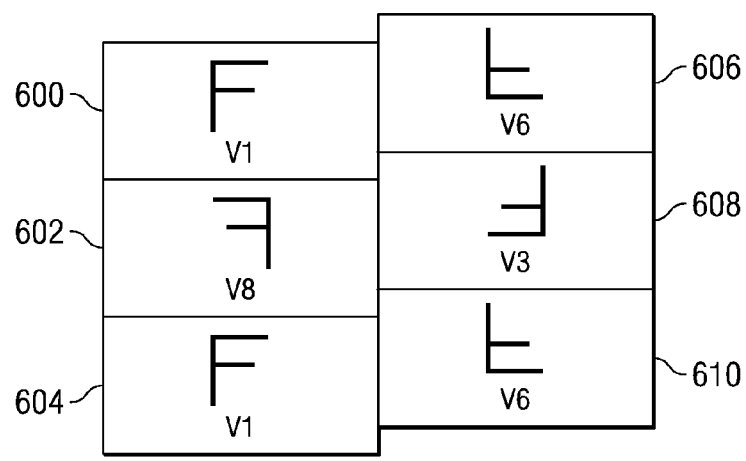
FIG. 7 is a diagram showing the views of the array of six memory cells of FIG. 6.
Figure 6:
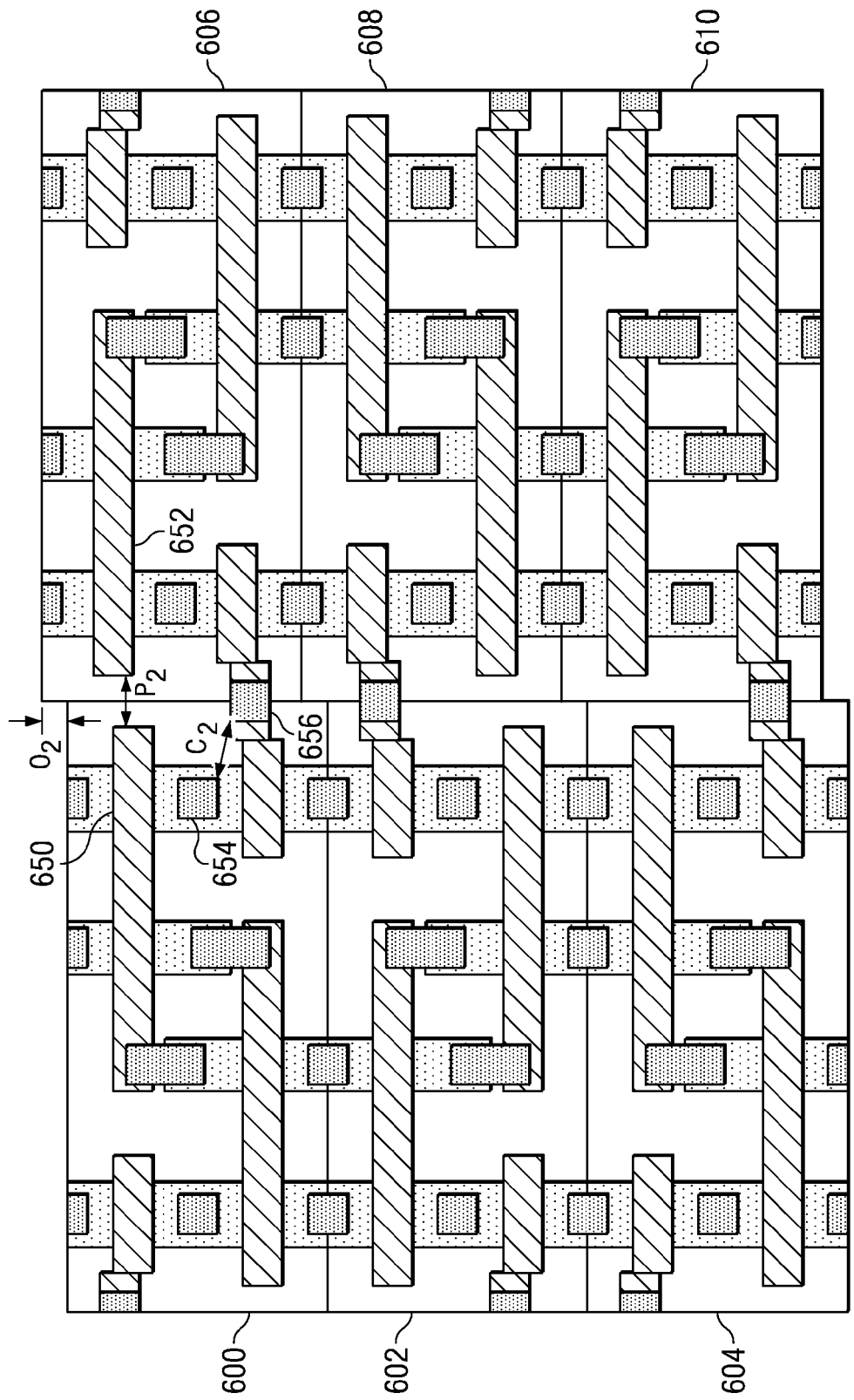
FIG. 6 is a layout diagram of an array of six memory cells of the present invention that are electrically equivalent to the memory cell of FIG. 2.

Turning now to FIG. 6, there is a layout diagram of an array of six memory cells of the present invention that are electrically equivalent to the memory cell of FIG. 2. Each transistor of the memory cell is in the same relative position as previously explained with respect to FIG. 3. The memory cells are placed in the configuration indicated by the diagram of FIG. 7. Memory cells 600, 602, and 604 form a first array of memory cells placed in views V1, V8, and V1, respectively. Memory cells 606, 608, and 610 form a second array of memory cells placed in views V6, V3, and V6, respectively. In an alternative embodiment, memory cells 606, 608, and 610 may have slight layout variations relative to memory cells 600, 602, and 604. Thus, the placement of the first and second arrays of memory cells have alternating views, but the alternating views of the first array are different from the alternating views of the second array. This second array of memory cells is adjacent the first array of memory cells and offset by a distance $O_2$. This distance $O_2$ is half the width of polycrystalline silicon gate 650. Thus, the upper edge of polycrystalline silicon gate 650 is aligned with the center of polycrystalline silicon gate 652.

The offset results in gates 650 and 652 not being collinear as they were in the prior art. Since gate 650 forms the gate of an N-channel drive transistor of memory cell 600 and gate 652 forms the gate of an N-channel drive transistor of memory cell 606, the N-channel drive transistor of memory cell 600 is offset from and not collinear with an adjacent N-channel drive transistor of memory cell 606. In the example of FIG. 6, all of the transistor gates of the memory cells 600, 602, and 604 are offset/not collinear with the transistor gates of memory cells 606, 608 and 610 respectively.

Metal-to-polycrystalline silicon contact 656 and the underlying polycrystalline silicon wordline WL geometry are shared between memory cells 600 and 606. The polycrystalline silicon wordline WL, therefore, must be stepped by the offset distance $O_2$ to properly align with metal-to-polycrystalline silicon contact 656. The steps are formed by three series-connected rectangular geometries. Patterning of these three rectangular geometries is slightly more difficult than the corresponding single rectangle (FIG. 3) of the prior art. The steps, however, advantageously permit the offset of otherwise aligned geometries so that the memory cell size may be reduced without yield loss. Edges of the final wordline WL geometry after fabrication will not have corners as indicated. All corners of the polycrystalline silicon wordline WL geometry will be rounded so that the transition between memory cells 600 and 606 is generally a smooth curve of substantially uniform width.

A semiconductor integrated circuit is fabricated by depositing a semiconductor layer, forming a photoresist pattern on a part of the layer, and etching the remaining exposed part of the layer to produce appropriate geometries. The photoresist pattern is defined by exposing a photo sensitive material otherwise known as photoresist preferably with short wave ultraviolet light beamed through a patterned mask or reticle. Areas of photoresist that are exposed to the light are hardened. Soft unexposed areas of the photoresist are then removed leaving an exposed part of the semiconductor layer. Alternatively, with other types of photoresist, the exposed part is removed and the unexposed part is hardened. When submicrometer pattern features approach the wave length of the light, however, complex diffraction patterns form around and between these features due to constructive and destructive interference. These complex diffraction patterns affect the contrast between exposed and unexposed areas of the photoresist. Also, the proximity of one pattern may affect the size or shape of a nearby pattern. As a result, corners of exposed areas such as corners of polycrystalline silicon gate geometries receive less light than central areas. This reduced exposure at the corners produces a rounding effect. A similar effect is observed for square contact holes which appear as circles in the semiconductor layer. For long and narrow geometries, this reduced exposure may also decrease the length of the geometry.

Some compensation for these effects of corner rounding and reduced length is possible by adjusting the size of the reticle pattern so that it is wider and longer than the desired final size of the semiconductor layer. This compensation is limited, however, as space between nearby geometries decreases and the contrast between exposed and unexposed areas is too small. Design rules are established for the minimum spacing of semiconductor layer geometries. The required space between geometries depends on the width of the geometries and the distance over which a minimum space between geometries occurs. Narrow width geometries spaced end to end, for example, require less space if the geometries are offset in a direction orthogonal to the direction of spacing such that the distance over which the minimum space occurs is reduced. As the offset is increased, the minimum spacing in the direction orthogonal to the offset may be reduced. This offset permits more light to reach exposed areas and reduces diffraction patterns in unexposed areas. Thus, a reduction in minimum spacing is possible because of a corresponding increase in contrast between exposed and unexposed regions at the minimally spaced ends. Where the width of the geometries is less than or equal to the space between the geometries, an offset equal to half the width of the width gives a significant reduction in the required minimum space even though there is still an overlap of the ends of the geometries in the direction of the offset. For offsets greater than the width of the narrow geometries, the ends no longer overlap in the direction of the offset, and an even greater reduction in the minimum required space in the direction orthogonal to the offset is possible.

Referring back to FIG. 6, the critical distance $P_2$ between the opposing ends of N-channel drive transistor gates 650 and 652 can be reduced due to the increased contrast between exposed and unexposed regions with the offset distance $O_2$. Thus, the horizontal dimension of the memory cell may be reduced. The critical distance $P_2$ may be less than the critical distance $P_1$ of FIG. 3 without an offset due to the increase in contrast between exposed and unexposed areas. The vertical dimension of each memory cell of FIG. 6, therefore, is the same as the memory cells of FIG. 3. The horizontal dimension of each memory cell of FIG. 6, however, is approximately 2.5 percent less than the memory cells of FIG. 3. This reduced horizontal dimension reduces the horizontal dimension of volatile memory array 1714 (FIG. 17) by more than 2 percent, since the memory cells occupy most of the memory array area. Moreover, this reduction in memory array area has no adverse effect on yield, and critical distance $P_2$ with offset $O_2$ is less than or equal to critical distance $P_1$ of the prior art with no offset. Critical distance $C_2$ between metal-to-N+ contact 654 and metal-to-polycrystalline silicon contact 656 is also reduced as the memory cell dimension is reduced. A combination of offset and cell width is chosen such that critical distance C2 does not significantly reduce yield. For the embodiment of FIG. 6, the magnitude of the offset and width reduction of the cell is limited by critical distance $C_2$.

Figure 8A:
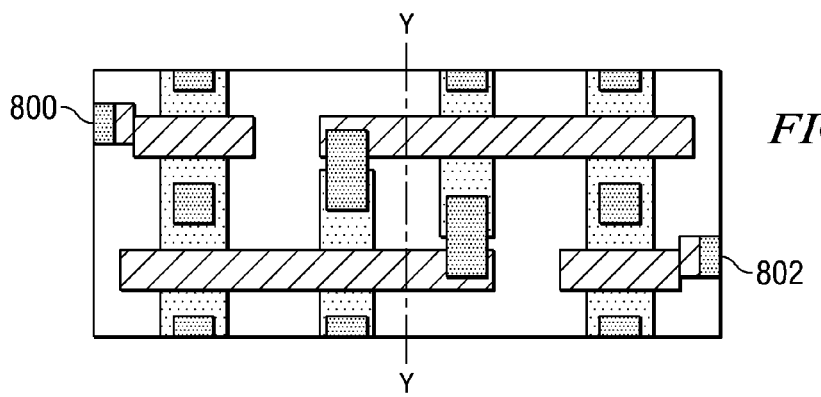
FIG. 8A is a layout diagram of a single memory cell of the present invention.
Figure 8B:
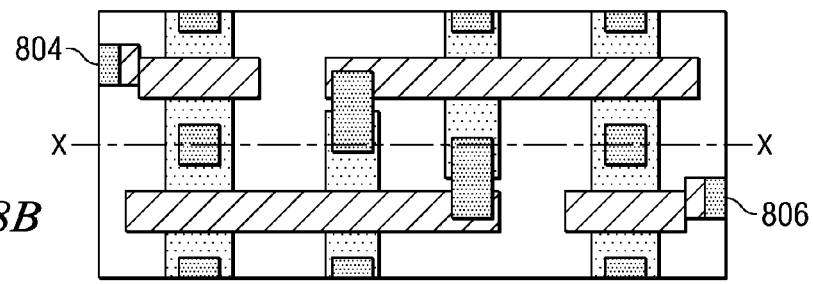
FIG. 8B is another layout diagram of a single memory cell of the present invention.

FIGS. 8A and 8B illustrate the asymmetry of memory cells of the present invention. The memory cells are placed in view V1. A vertical line Y—Y separates the left and right halves of the memory cell of FIG. 8A. If the right half is rotated 180 degrees and placed on top of the left half, however, all geometrical layers are not aligned. The half contact 802 and underlying polycrystalline silicon, for example, are not aligned with the half contact 800. The top and bottom halves of the cell of FIG. 8B are separated by horizontal line X—X. If the bottom half is rotated 180 degrees and placed on top of the top half, then half contact 802 and underlying polycrystalline silicon are not aligned with the half contact 800. Each half of the memory cell of this embodiment of the present invention, therefore, is preferably asymmetrical with the other half of the memory cell.

Figure 9:
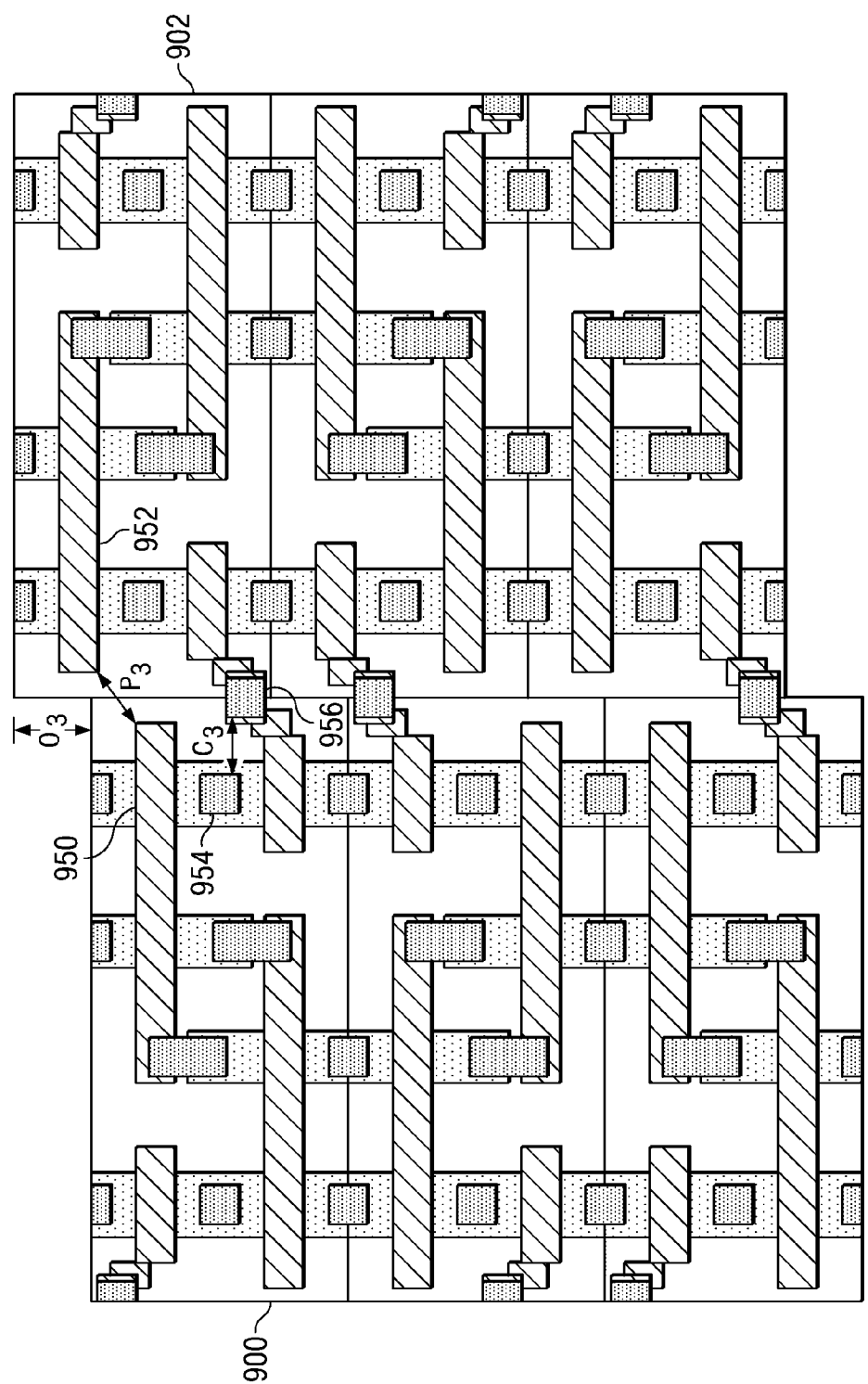
FIG. 9 is a layout diagram of another embodiment of an array of six memory cells of the present invention having the same views as in FIG. 7.

Referring now to FIG. 9, there is a layout diagram of another embodiment of the present invention. The layout diagram is an array of six memory cells that are electrically equivalent to the memory cell of FIG. 2. Each transistor of the memory cell is in the same relative position as previously explained with respect to FIG. 6. The memory cells are placed in the configuration indicated by the diagram of FIG. 7. The offset, however, has been increased to distance $O_3$. The increased offset $O_3$ moves N-channel polycrystalline silicon gate 952 with respect to N-channel polycrystalline silicon gate 950 so that there is no overlap of their widths in the vertical direction. As in the previous embodiment, the N-channel polycrystalline silicon gates 952 and 950, as well as the drive transistors of which they are a part, are not collinear as in the prior art. This offset of N-channel polycrystalline silicon gate 952 is optimal and approximately equidistant between adjacent polycrystalline silicon geometries. The offset distance $O_3$ is one half the pitch of the gates. This increased vertical offset $O_3$ permits a reduction in horizontal space between polycrystalline silicon gate 952 and polycrystalline silicon gate 950. As a result, critical distance $P_3$ may be even less than critical distance $P_1$ (FIG. 3) due to increased contrast between exposed and unexposed areas of the photoresist pattern as previously explained. This provides a horizontal dimension of the memory cell that is approximately 5 percent less than the prior art memory cell of FIG. 3 and approximately 2.5 percent less than the previous embodiment of FIG. 6. The limiting critical dimension is now distance $P_3$ between polycrystalline silicon gate 950 and polycrystalline silicon gate 952. For alternative embodiments of the present invention having different polycrystalline silicon gate spacing or design rules, however, cell size might be limited by critical distance $C_3$ or other spacing constraints.

Figure 10:
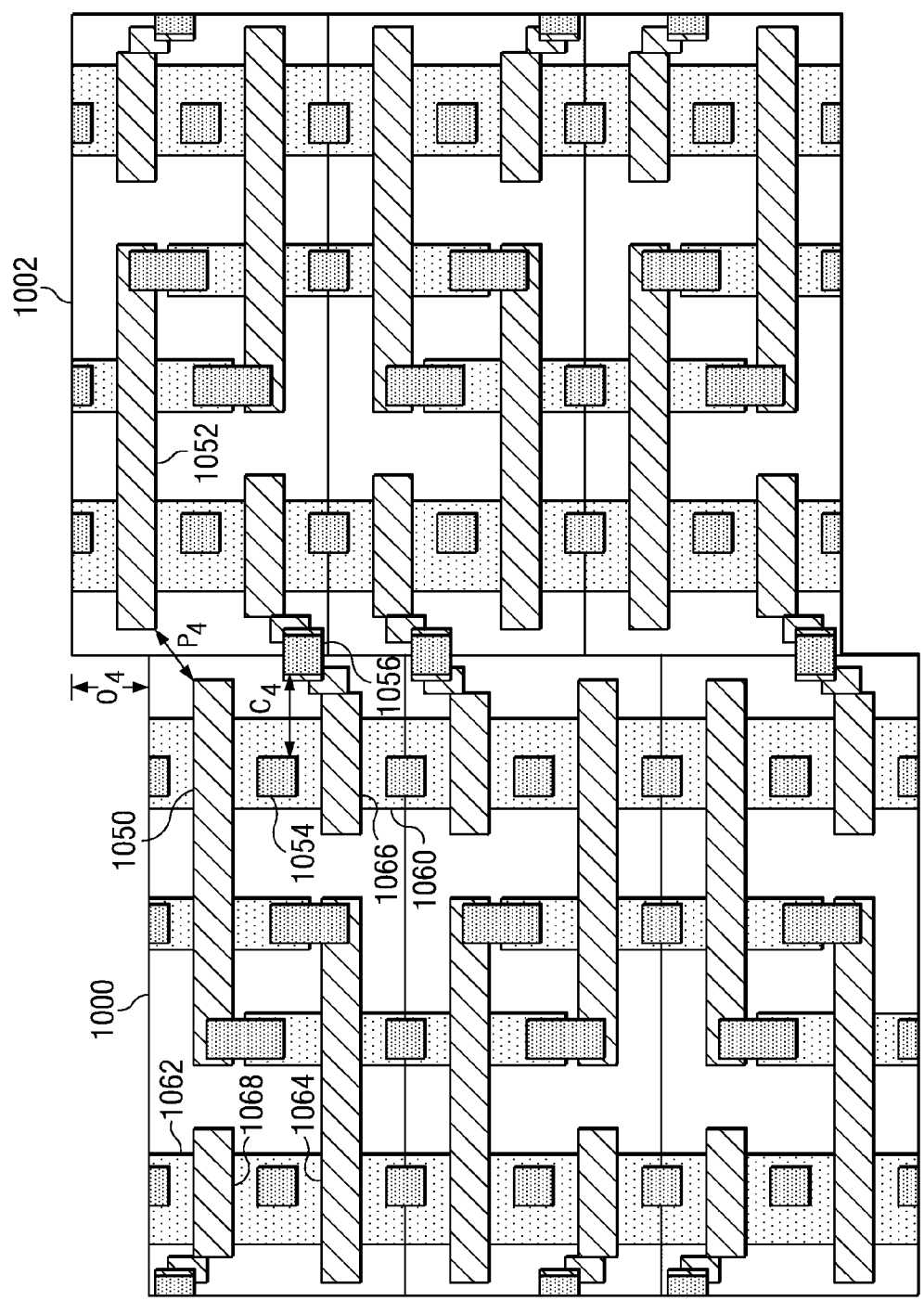
FIG. 10 is a layout diagram of yet another embodiment of an array of six memory cells of the present invention having the same views as in FIG. 7.

The layout diagram of FIG. 10 is yet another embodiment of the present invention. The layout diagram is an array of six memory cells of that are electrically equivalent to the memory cell of FIG. 2 except for wider transistors as described below. Each transistor of the memory cell is in the same relative position as previously explained with respect to FIG. 6. The memory cells are placed in the configuration indicated by the diagram of FIG. 7. The offset distance $O_4$ is the same as the previous offset distance $O_3$. The horizontal dimension of the memory cell, however, is approximately the same as the memory array of FIG. 6 or approximately 2.5 percent less than the prior art memory cell of FIG. 3, but with wider transistors. This embodiment, therefore, significantly increases the critical distance $P_4$, between N-channel polycrystalline silicon gate 1050 and N-channel polycrystalline silicon gate 1052 of the memory cells 1000 and 1002. The critical distance $C_4$, between metal-to-N+ contact 1054 and metal-to-polycrystalline silicon contact 1056, also increases relative to $C_3$ (FIG. 9) as allowed by the wider N-channel transistors 1050, 1064, 1066, and 1068. The limiting critical dimension as cell size is reduced, therefore, may be $P_4$, $C_4$, or both. With C4 greater than C3 as allowed by the wider transistors, C4 becomes less limiting, allowing a larger offset and reduction of P4. The additional width of the memory cell relative to the memory cell of FIG. 9 permits an increase in N+ width 1060 and 1062 at each side of the memory cell 1000. As a result, the widths of N-channel latch transistors 1050 and 1064 and access transistors 1066 and 1068 are increased. This increased width advantageously reduces resistance between bit lines and the memory cell latch, thereby decreasing read and write times of the memory cell.

Figure 11:
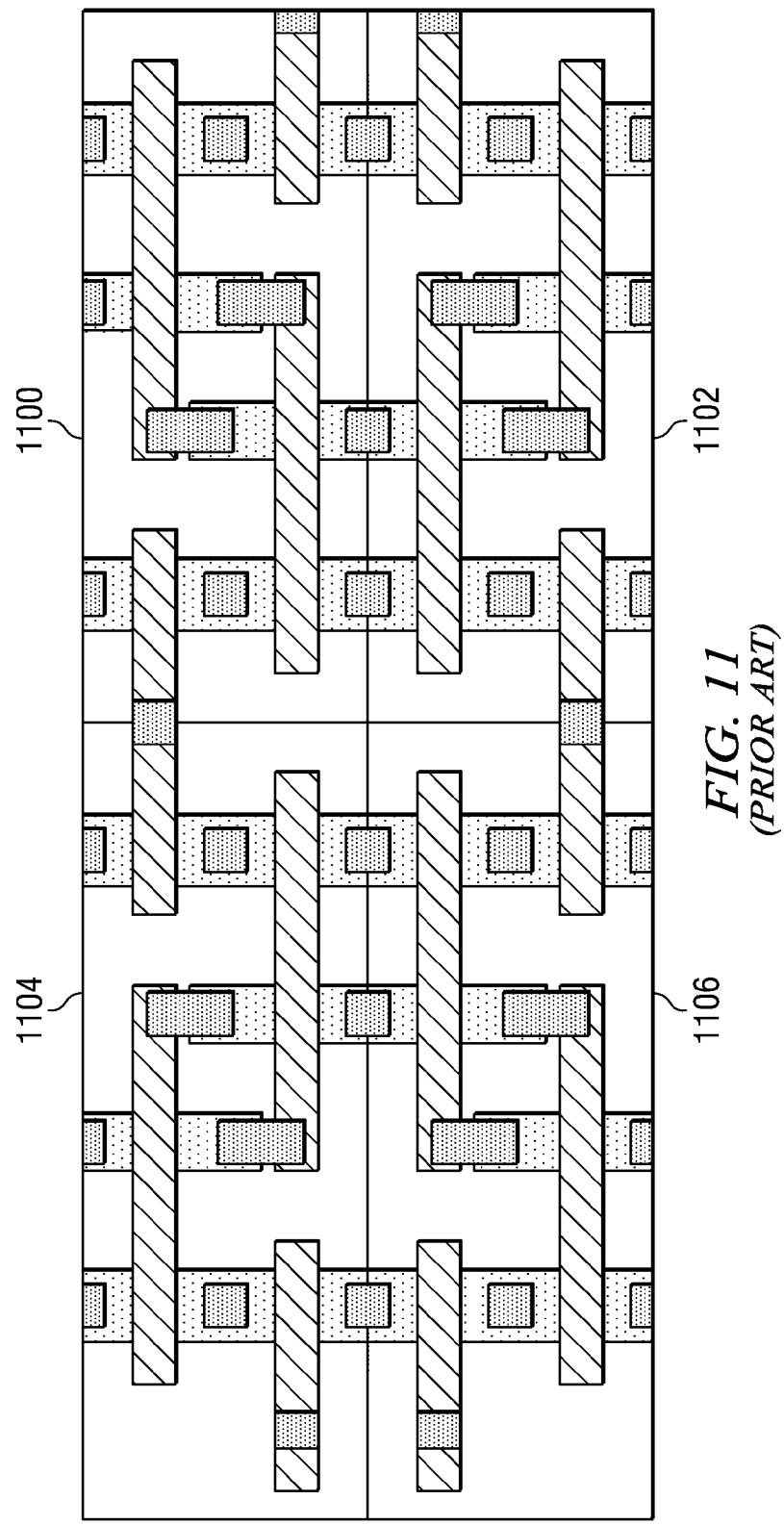
FIG. 11 is a layout diagram of edge cells that may be used to terminate the left edge of an array formed by memory cells of FIG. 3.

Memory arrays are typically terminated at the perimeter by special cells that do not store data. Perimeter memory cells that do store data, therefore, are bounded by geometrical patterns similar to all other memory cells to minimize adverse photolithographic and soft error effects. These special cells are often referred to as dummy cells or edge cells to distinguish them from actual memory cells. FIG. 11 is a layout diagram of edge cells 1104 and 1106 that may be used to terminate the left edge of an array formed by prior art memory cells 1100 and 1102 of FIG. 3. A single edge cell is placed in view V1 1106 and in view V6 1104.

Figure 12:
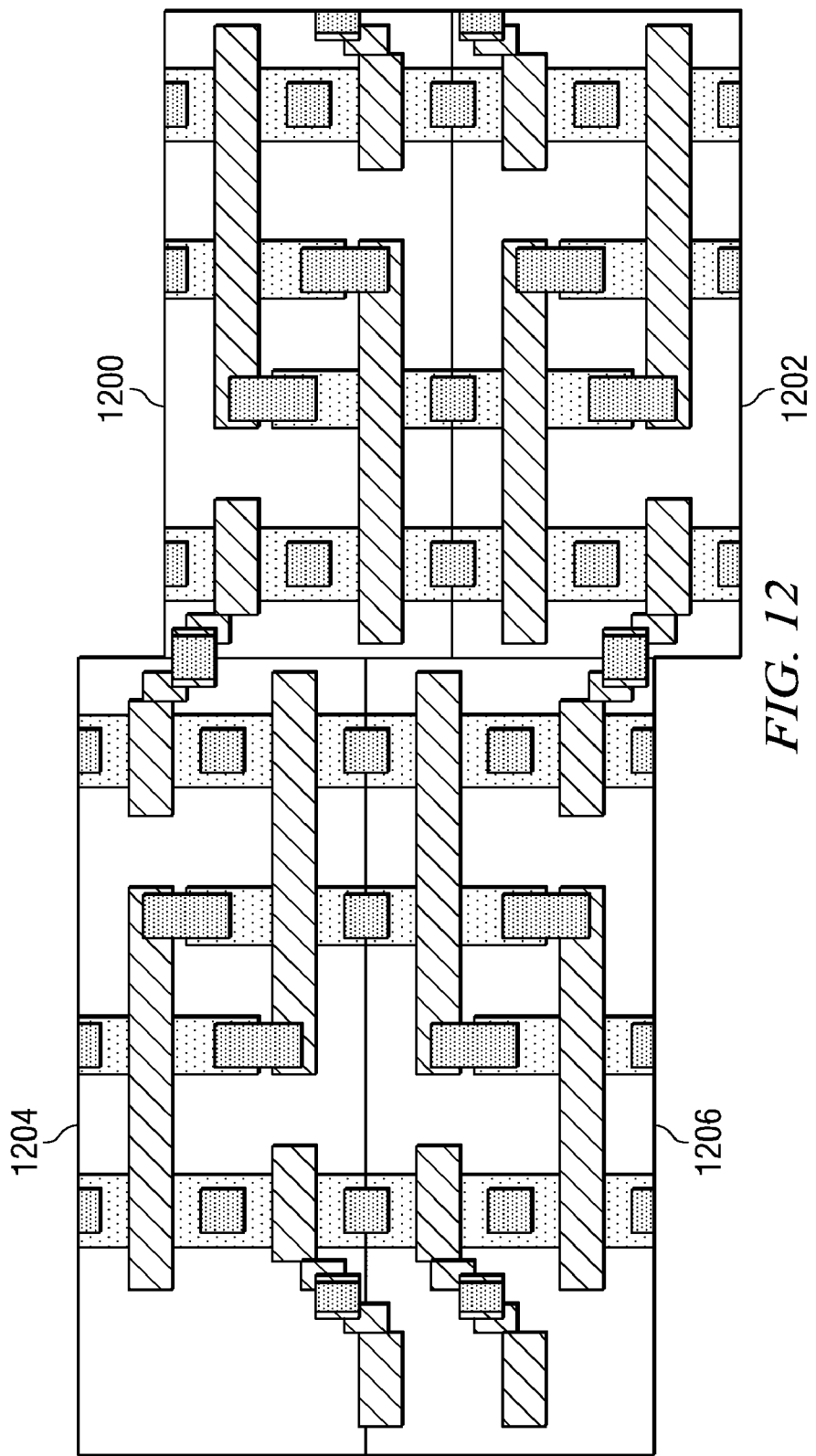
FIG. 12 is a layout diagram of edge cells that may be used to terminate the left edge of an array formed by memory cells of FIG. 9.

Referring to FIG. 12, there is a layout diagram of edge cells that may be used to terminate the left edge of an array formed by memory cells of FIG. 9. Memory array cells 1200 and 1202 are placed in views V1 and V8, respectively. Edge cells 1204 and 1206 are arranged to terminate memory cells 1200 and 1202, respectively. Edge cells 1204 and 1206, however, are not different views of a single cell. They are different cells that are alternately placed to terminate their respective memory cells.

Figure 13:
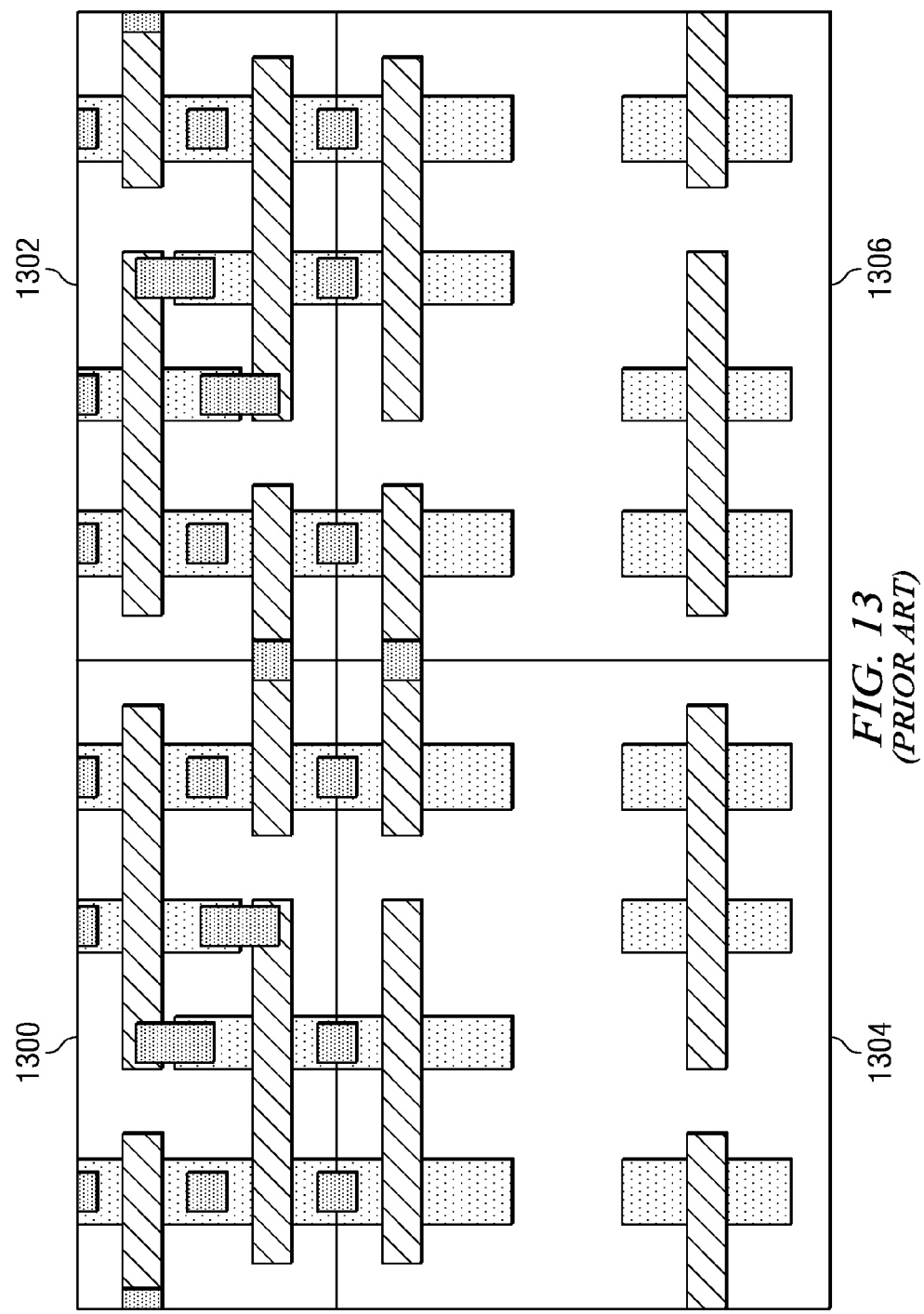
FIG. 13 is a layout diagram of edge cells that may be used to terminate the bottom edge of an array formed by memory cells of FIG. 3.
Figure 14:
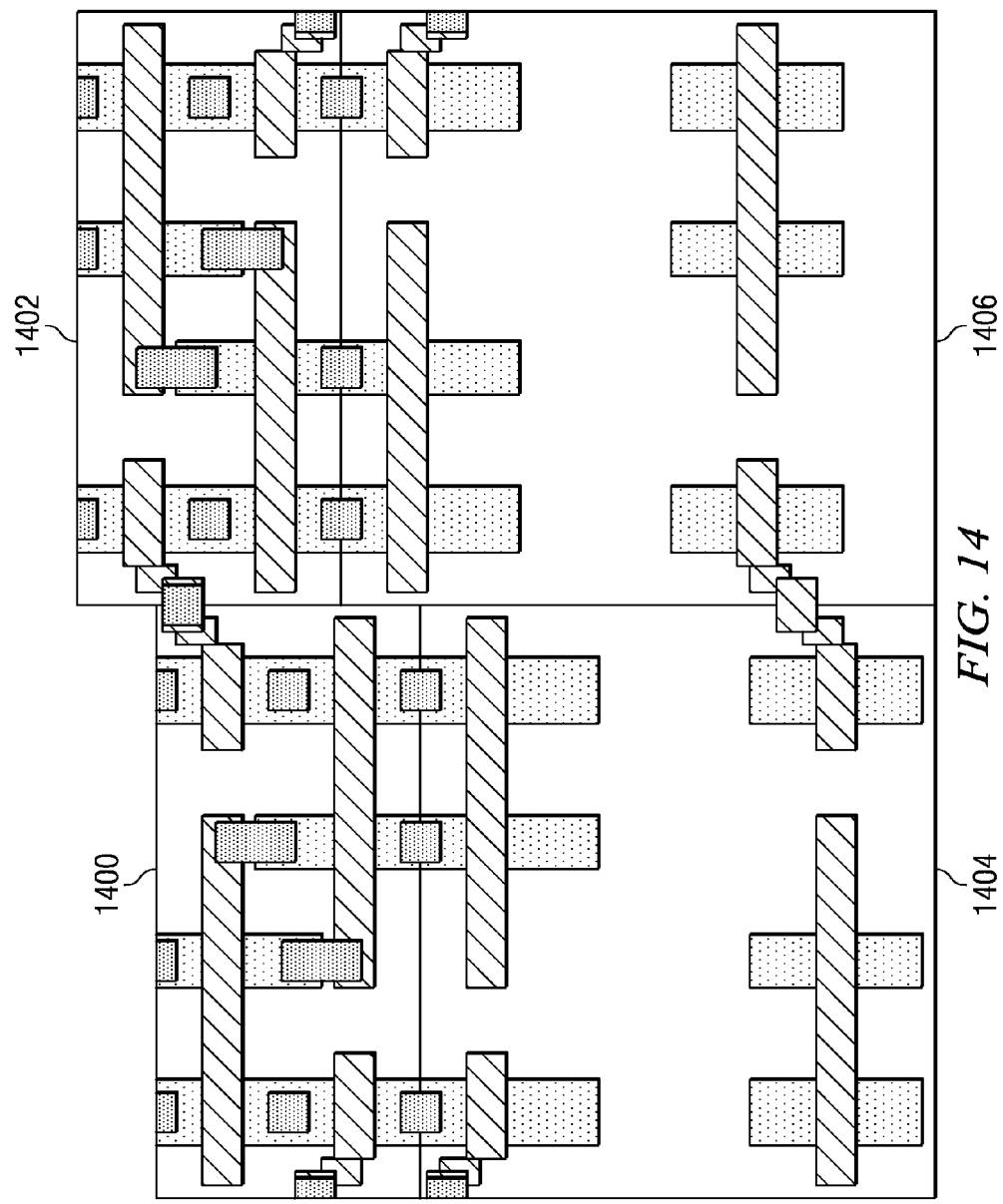
FIG. 14 is a layout diagram of edge cells that may be used to terminate the bottom edge of an array formed by memory cells of FIG. 9.

A similar difference occurs between edge cells at the bottom perimeter of the memory array. FIG. 13 is a layout diagram of edge cells that may be used to terminate the bottom edge of a prior art memory array formed by memory cells of FIG. 3. Edge cells 1304 and 1306 terminate prior art memory cells 1300 and 1302, respectively. Edge cell 1304 is a mirror image about a vertical axis of edge cell 1306. Thus, only a single edge cell with different views terminates the bottom of the memory array of FIG. 3. By way of comparison, edge cells of FIG. 14 terminate the bottom edge of an array formed by memory cells of FIG. 9. Edge cells 1404 and 1406 terminate memory cells 1400 and 1402, respectively. Edge cells 1404 and 1406, however, are different cells.

Figure 3:
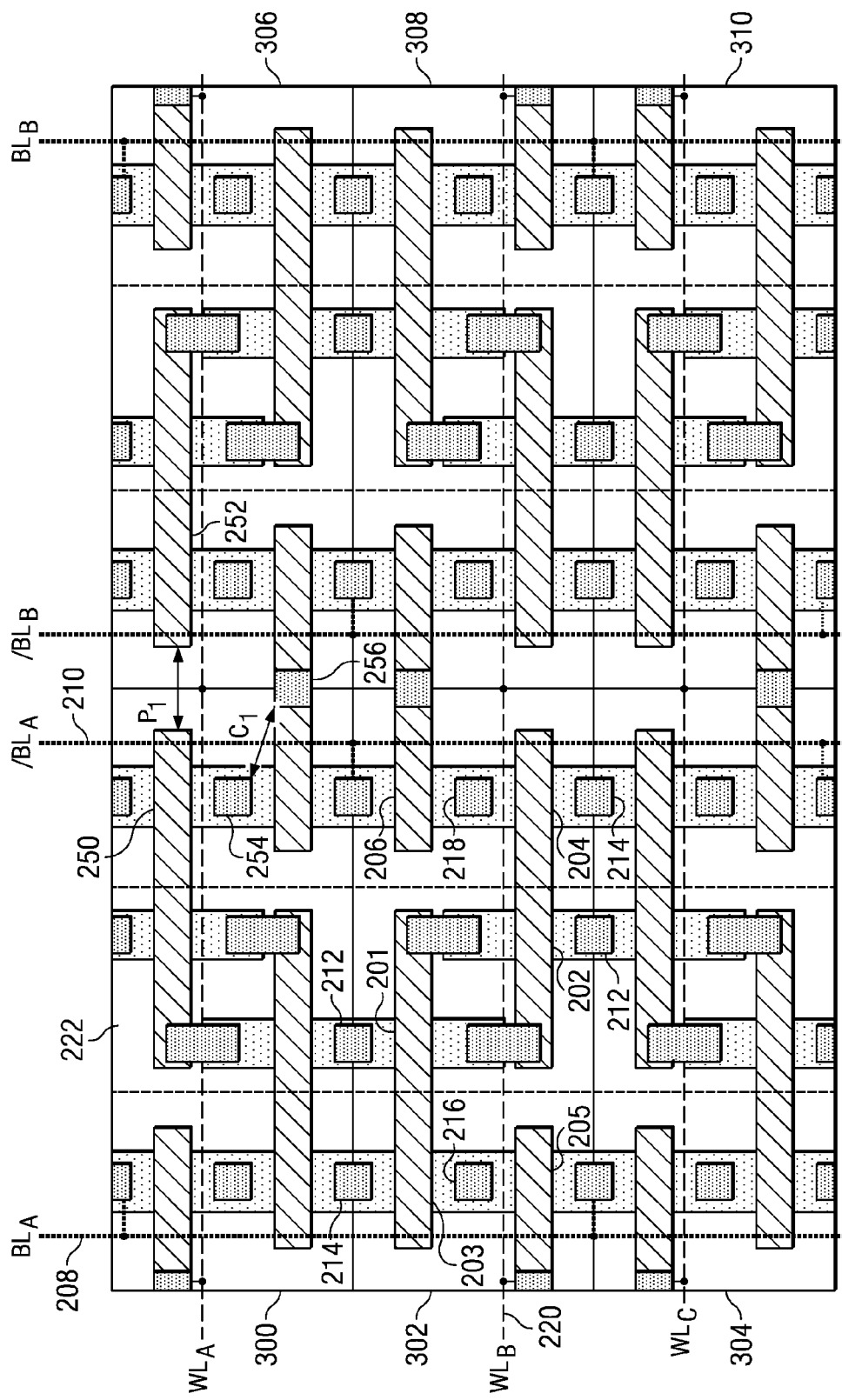
FIG. 3 is a layout diagram of the prior art of an array of six memory cells as in FIG. 2.
Figure 5A:
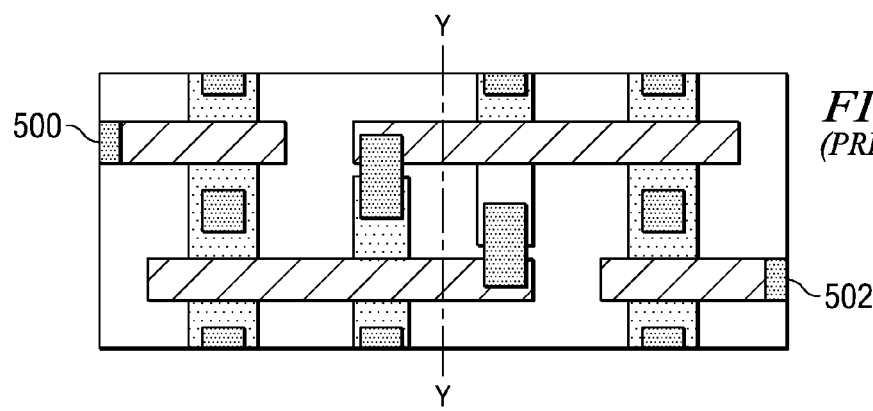
FIG. 5A is a layout diagram of a single memory cell of the prior art as in FIG. 2.
Figure 5B:
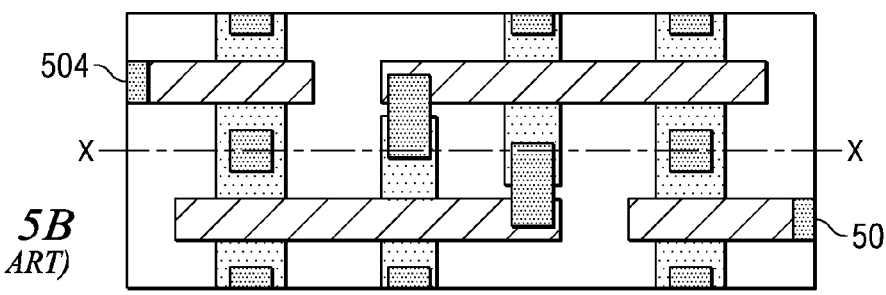
FIG. 5B is another layout diagram of a single memory cell of the prior art as in FIG. 2.
Figure 15:
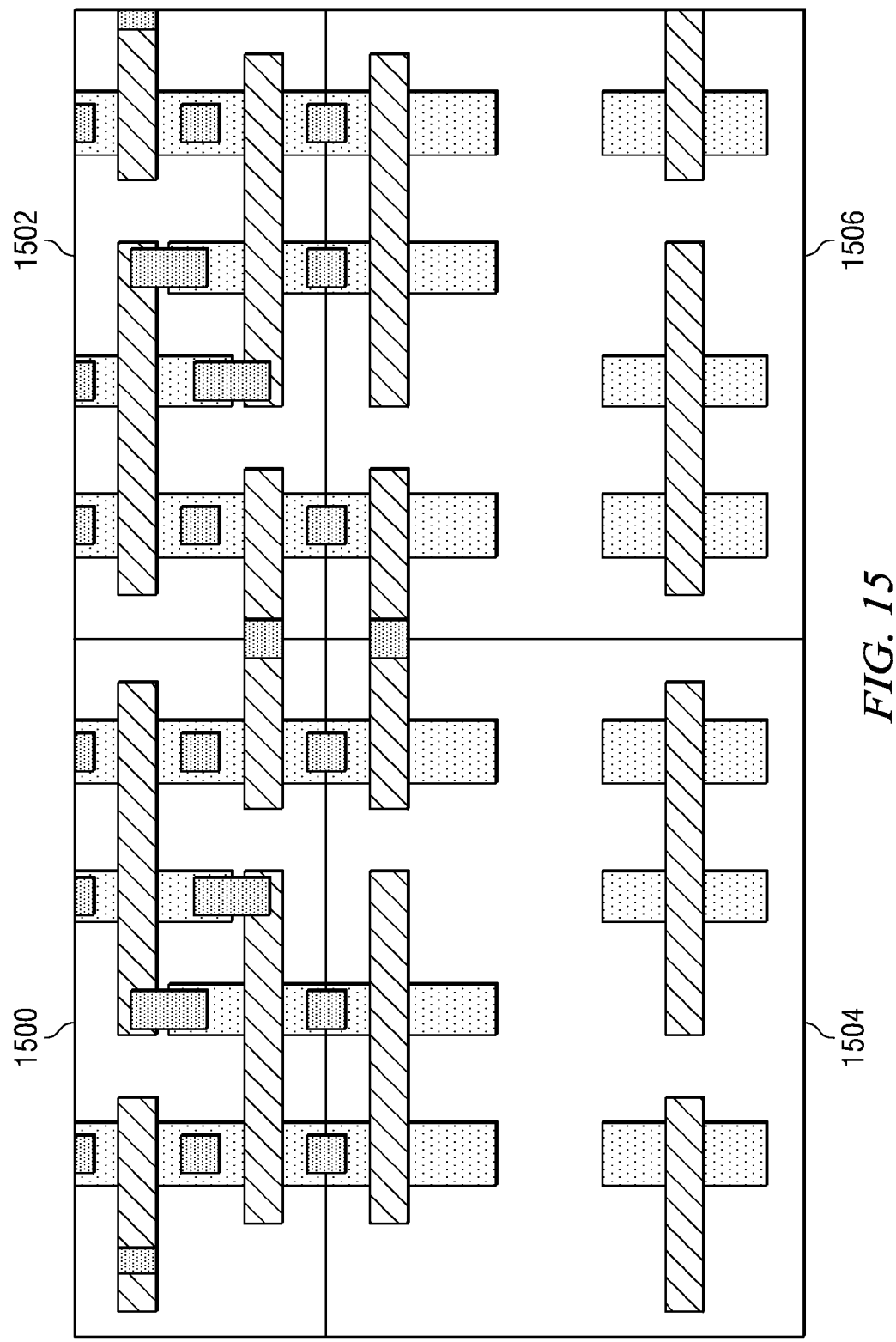
FIG. 15 is a layout diagram of an edge cell that may be used to terminate the lower left corner of an array formed by memory cells of FIG. 3.

Turning now to FIG. 15, there is a corner cell that may be used to terminate the lower left corner of an array formed by memory cells of FIG. 3. The corner cell 1504 is arranged to terminate left edge cell 1500 and lower edge cell 1506. As previously explained, edge cells 1500 and 1506 terminate the left and lower edges, respectively, of prior art memory cell 1502. A single edge cell 1500, placed in different views, terminates left and right edges of the memory array of FIG. 3. Likewise, a single edge cell 1506, placed in different views, terminates top and bottom edges of the memory array of FIG. 3. Thus, a single corner cell 1504, placed in different views, may be used to terminate all four corners of the memory array of FIG. 3.

Figure 16A:
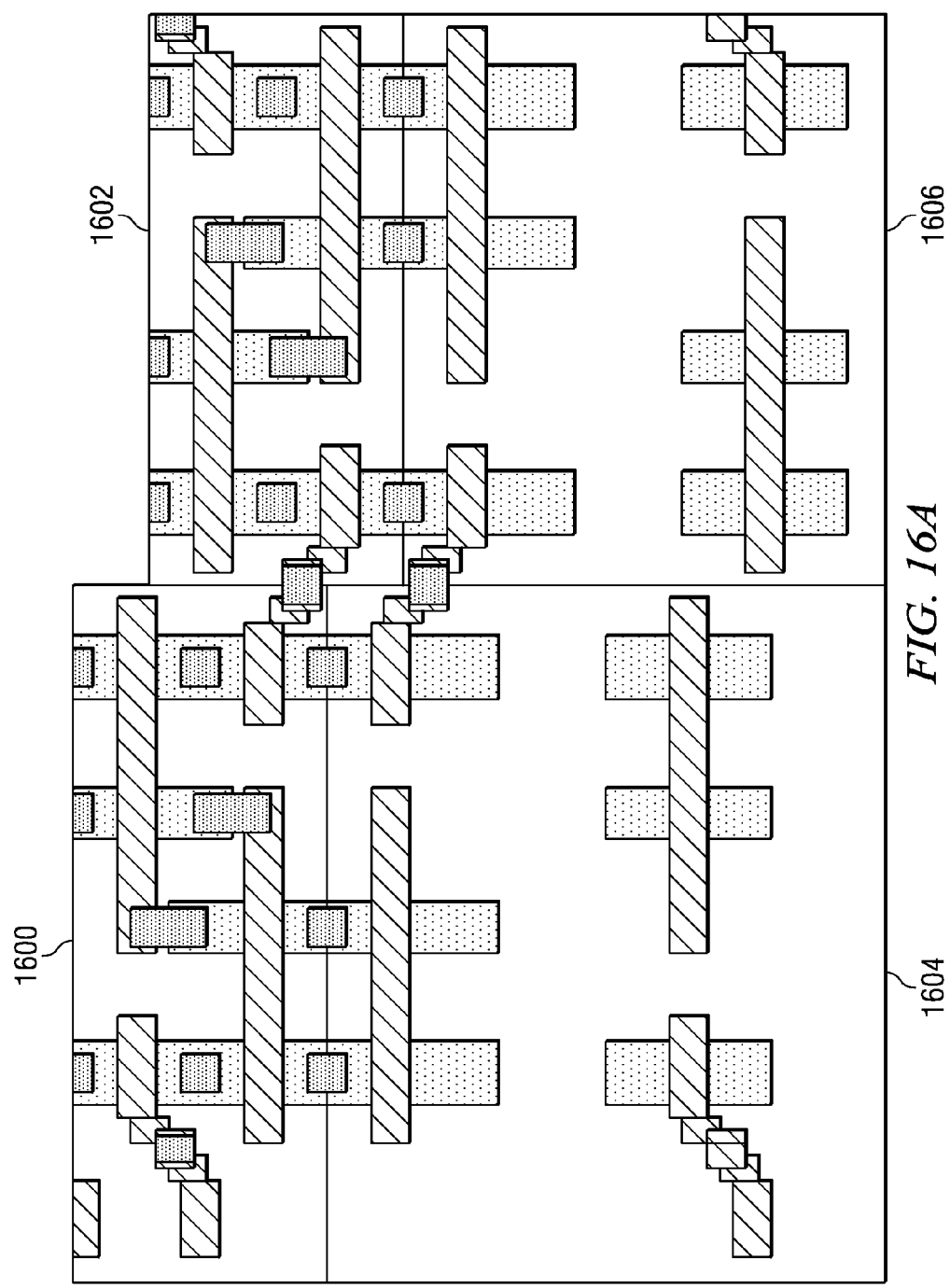
FIG. 16A is a layout diagram of an edge cell that may be used to terminate the lower left corner of an array formed by memory cells of FIG. 9.
Figure 16B:
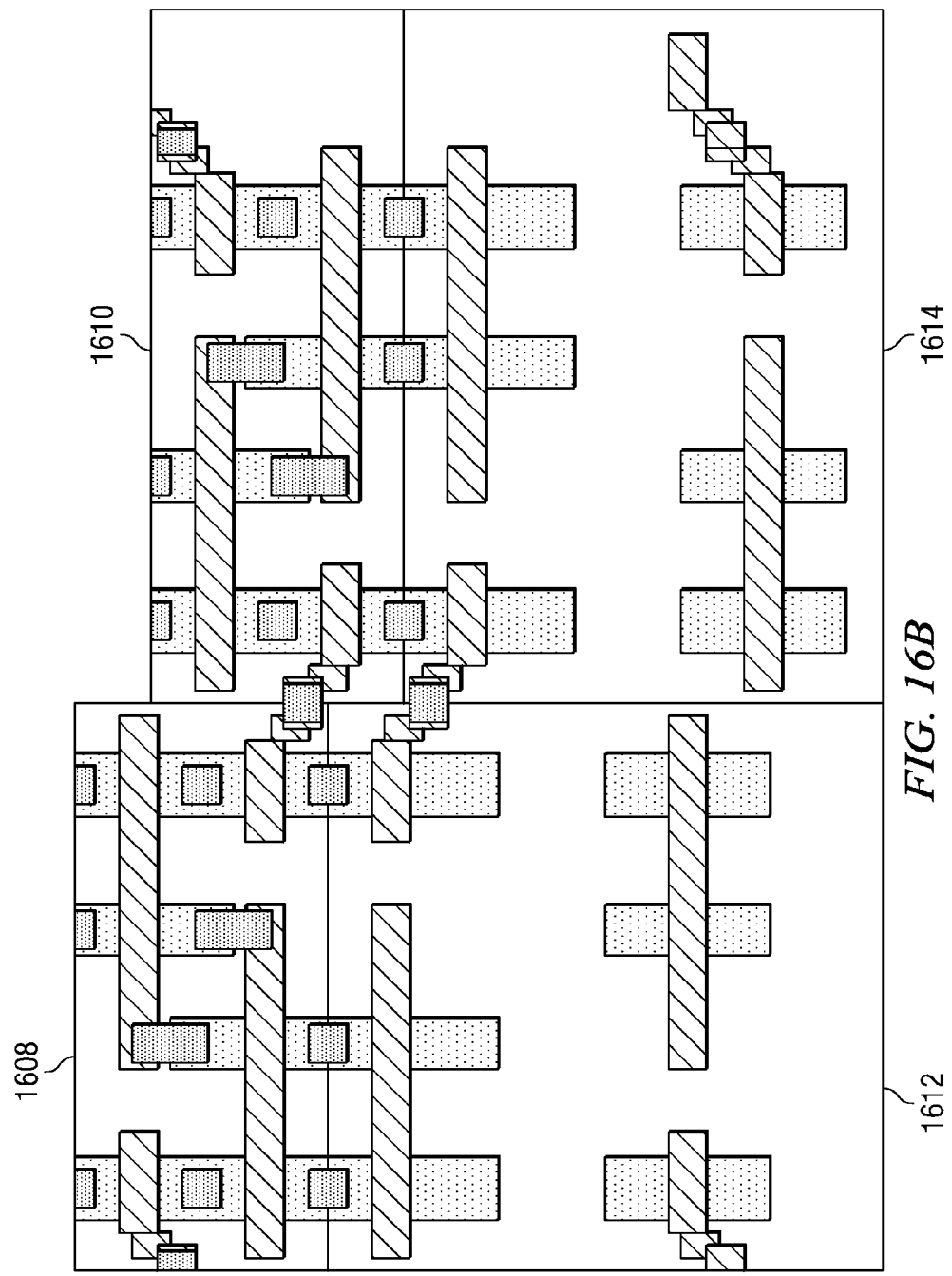
FIG. 16B is a layout diagram of an edge cell that may be used to terminate the lower right corner of an array formed by memory cells of FIG. 9.

Referring now to FIG. 16A, there is a layout diagram of an edge cell 1604 that may be used to terminate the lower left corner of an array formed by memory cells of FIG. 9. The edge cell 1604 terminates left edge cell 1600 and lower edge cell 1606, which terminate memory cell 1602. FIG. 16B is a layout diagram of a lower right corner edge cell 1614 of an array formed by memory cells of FIG. 9. The edge cell 1614 terminates right edge cell 1610 and lower edge cell 1612, which terminate memory cell 1608. Since edge cells of FIG. 16A and FIG. 16B are different, corner cells 1604 and 1614 are also different. In fact, it is preferable to employ four different corner cells for each respective corner to terminate the memory array of FIG. 9. The unique edge cells of the present invention, however, require no more layout area than conventional edge cells.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the gate layer material is described throughout as being polycrystalline silicon. Other gate material, such as metal gates, may alternatively be used without departing from the scope of the invention. Moreover, advantages of the present invention are not limited to memory cells. In general, a cell is any repeated single or multilevel geometric pattern. For example, staggered array techniques of the present invention may be used to reduce dimensions of any single or multilevel geometric array such as decoders, sense amplifiers, or other circuits. Moreover, critical dimensions between exemplary layers such as polycrystalline silicon and contacts are not to be construed in a limiting sense. Such critical dimensions may occur between active regions, metal gates, metal interconnect, or other layers. In view of the foregoing discussion, it is intended that the appended claims encompass any such modifications or embodiments.

What is claimed is:

1. An integrated circuit comprising a memory array which comprises:
    a first array of memory cells extending in a first direction;
    a second array of said memory cells extending in said first direction and adjacent to said first array in a second direction, wherein the memory cells of said first and second arrays are substantially rotated or mirror views of each other, and wherein said second array is offset from said first array in said first direction.

2. The memory array of claim 1, wherein said memory cells each comprise a transistor gate and wherein said offset is approximately equal to one half a width of said transistor gate.

3. The memory array of claim 1, wherein said memory cells each comprise a pair of transistor gates and wherein said offset is not substantially greater than one half a pitch of said pair of transistor gates.

4. The memory array of claim 1, wherein said memory cells comprise static random access memory cells.

5. A memory array comprising a plurality of memory cells placed in alternating views wherein:
    each of said memory cells comprises a plurality of transistor gates;
    a first of said memory cells is placed adjacent a second of said memory cells in a first direction;
    the transistor gates of said first memory cell are offset in a second direction from the transistor gates of said second memory cell such that none of the transistor gates in said first memory cell are collinear with said transistor gates of said second memory cell.

6. The memory array of claim 5, wherein said offset is approximately equal to one half a width of one of said plurality of transistor gates.

7. The memory array of claim 5, wherein said offset is not substantially greater than one half a pitch of the transistor gates of the memory cell.

8. The memory array of claim 5, wherein said memory cells comprise static random access memory cells.

9. A memory array comprising a plurality of memory cells placed in alternating views wherein:
    each of said memory cells comprises at least one driver transistor gate;
    a first of said memory cells is placed adjacent a second of said memory cells;
    the driver transistor gate of said first memory cell is offset in both a vertical and horizontal direction from the nearest driver transistor gate of said second memory cell such that the driver transistor gate in said first memory cell is not collinear with the nearest driver transistor gate of said second memory cell.

10. The memory array of claim 9, wherein said offset in the vertical direction is approximately equal to one half a width of one of said plurality of transistor gates.

11. The memory array of claim 9, wherein said memory cells comprise static random access memory cells.

12. A memory array comprising a first driver transistor and a second driver transistor; said first driver transistor comprising a first active region and a first gate crossing said first active region; said first driver gate comprising a first end extending from a first side of said first active region in a first direction; said second driver transistor comprising a second active region having a second side adjacent to and separated from to said first side of said first active region and a second gate crossing said second active region having a second end extending from said second side of said second active region in a direction substantially opposite to said first direction; said second end of said second gate adjacent and separated from said first end of said first gate; wherein said first end of said first gate is offset from said second end of said second gate in a second direction substantially orthogonal to said first direction.

13. The memory array of claim 12 further comprising a third drive transistor; said third drive transistor comprising a third gate crossing said first active region; said third gate adjacent and separated from said first gate; said third gate having a third end extending from said first side of said first active region in said first direction; wherein said second end of said second gate is offset from said first end of said first gate in a direction toward said third end of said third gate.

14. The memory array of claim 13 wherein said second end of said second gate is substantially equidistant from said first end of said first gate and said third end of said third gate.

15. The memory array of claim 12 further comprising a first pass transistor and a second pass transistor; said first pass transistor comprising a fourth gate crossing said first active region, said forth gate being adjacent and separated from said first gate; said second pass transistor comprising a fifth gate crossing said second active region, said fifth gate being adjacent to and separated from said second gate; wherein said fourth gate is offset from said fifth gate in said second direction and wherein said fourth gate is connected to said fifth gate.

16. A method for placing transistors in an array of SRAM cells, wherein said SRAM cells comprise transistors with gates running in a first direction and wherein said transistor gates are placed in the array substantially end-to-end, said method comprising the steps of:
   determining a minimum end-to-end lithographic spacing of directly aligned gate ends;
   placing a first transistor gate and a second transistor gate substantially end-to-end in a first direction and offset in a second direction substantially orthogonal to the first direction, wherein the substantially end-to-end spacing in the first direction is less than the minimum end-to-end lithographic spacing for directly aligned gate ends.

17. The method of claim 16 wherein the end-to-end spacing occurs at SRAM cell boundaries and the offset of the gates in the second direction is accomplished by offsetting the placement of adjacent cells.

18. A method of fabricating a memory array, comprising the steps of:
   placing a memory cell a plurality of times in a first array; and
   placing the memory cell a plurality of times in a second array; wherein the second array is placed adjacent the first array in a first direction and offset from the first array by an offset distance in a second direction.

19. A method as in claim 18, wherein the step of placing the memory cell a plurality of times in a first array comprises placing the memory cell in alternating views, and wherein the step of placing the memory cell a plurality of times in a second array comprises placing the memory cell in alternating views.

20. A method as in claim 19, wherein the alternating views of the first array are different from the alternating views of the second array.

21. A method as in claim 18, wherein the memory cell comprises a geometry of a first layer and wherein the geometry of one memory cell is offset from a collinear position with the geometry of an adjacent memory cell by the offset distance.

22. A method of fabricating an integrated circuit, comprising the step of:
   forming a first drive transistor and a second drive transistor for each of a plurality of memory cells, wherein the first drive transistor of a first memory cell is not collinear with either the first drive transistor of a second memory cell or the second drive transistor of the second memory cell, wherein said first and second memory cells are located adjacent to each other.

23. The method of claim 22, further comprising the step of forming a first pass transistor and a second pass transistor for each of the plurality of memory cells, wherein the first pass transistor of the first memory cell is not collinear with either the first pass transistor of the second memory cell or the second pass transistor of the second memory cell and wherein the first pass transistor of the first memory cell is connected to the first pass transistor of the second memory cell.

24. The method of claim 22, wherein the plurality of memory cells are static random access memory cells.

25. A method of fabricating an integrated circuit, comprising the steps of:
   forming a first drive transistor and a second drive transistor for each of a plurality of memory cells, wherein the first drive transistor of a first memory cell is offset both vertically and horizontally from both the first drive transistor of a second memory cell and the second drive transistor of the second memory cell, wherein said first and second memory cells are located adjacent to each other.

26. The method of claim 25, further comprising the step of forming a first pass transistor and a second pass transistor for each of the plurality of memory cells, wherein the first pass transistor of the first memory cell is offset both vertically and horizontally from both the first pass transistor of the second memory cell and the second pass transistor of the second memory cell and wherein the first pass transistor of the first memory cell is connected to the first pass transistor of the second memory cell.

27. The method of claim 25, wherein the plurality of memory cells are static random access memory cells.

* * * * *